US012603635B2

(12) United States Patent
Koto et al.

(10) Patent No.: US 12,603,635 B2
(45) Date of Patent: Apr. 14, 2026

(54) ACOUSTIC WAVE DEVICE AND MODULE

(71) Applicant: Sanan Japan Technology Corporation, Tokyo (JP)

(72) Inventors: Yuki Koto, Tokyo (JP); Shinichi Shioi, Tokyo (JP)

(73) Assignee: Sanan Japan Technology Corporation, Tokyo (JP)

( * ) Notice: Subject to any disclaimer, the term of this patent is extended or adjusted under 35 U.S.C. 154(b) by 295 days.

(21) Appl. No.: 18/461,325

(22) Filed: Sep. 5, 2023

(65) Prior Publication Data

US 2024/0088866 A1 Mar. 14, 2024

(30) Foreign Application Priority Data

Sep. 8, 2022 (JP) ................................. 2022-143280

(51) Int. Cl.
*H03H 9/05* (2006.01)
*H03H 9/72* (2006.01)

(52) U.S. Cl.
CPC ............ *H03H 9/059* (2013.01); *H03H 9/725* (2013.01)

(58) Field of Classification Search
CPC .... H03H 9/059; H03H 9/725; H03H 9/02102; H03H 9/0523; H03H 9/02834; H03H 9/08; H03H 9/02614; H03H 9/205; H03H 9/25; H03H 9/70

USPC .................................. 333/186–188, 193–196
See application file for complete search history.

(56) References Cited

U.S. PATENT DOCUMENTS

2014/0368299 A1* 12/2014 Yamashita ........... H03H 9/6483
333/195
2018/0013404 A1* 1/2018 Kawasaki .......... H03H 9/02834

FOREIGN PATENT DOCUMENTS

JP 2007184690 A 7/2007
JP 2010245739 A 10/2010
JP 2020150514 A 9/2020

* cited by examiner

*Primary Examiner* — Jorge L Salazar, Jr.
(74) *Attorney, Agent, or Firm* — Dorsey & Whitney LLP

(57) ABSTRACT

An acoustic wave device includes a wiring substrate, a wiring substrate-side wiring formed on the wiring board, a chip substrate opposed to the wiring substrate, a chip substrate-side wiring formed on the chip substrate, a plurality of resonators formed on the chip substrate and electrically connected to the chip substrate-side wiring, a plurality of bumps electrically connected to the wiring substrate-side wiring and the chip substrate-side wiring, and a heat dissipation bump bonded to a region of the chip board-side wiring electrically connected to a plurality of resonators and insulated from the wiring substrate-side wiring.

4 Claims, 4 Drawing Sheets

ACOUSTIC WAVE DEVICE AND MODULE

CROSS-REFERENCE TO RELATED APPLICATION(S)

This application claims priority to Japanese Application No. 2022-143280, filed Sep. 8, 2022, which are incorporated herein by reference, in their entirety, for any purpose.

BACKGROUND OF THE INVENTION

Field of the Invention

The present disclosure relates to an acoustic wave device and a module having an acoustic wave device.

Description of the Related Art

Patent Document 1 (JPA2010-245739) discloses an acoustic wave device. According to the acoustic wave device, a degree of freedom of the wiring or the like can be improved. As a result, the acoustic wave device can be miniaturized.

However, heat from a chip substrate hardly escapes inside the sealing portion of the acoustic wave device described in Patent Document 1. Therefore, the heat dissipation property of the chip substrate is low.

SUMMARY OF THE INVENTION

Some examples described herein may address the above-described problems. Some examples described herein may have an object to provide an acoustic wave device capable of improving heat dissipation of a chip substrate and a module including the acoustic wave device.

In some examples, an acoustic wave device includes a wiring substrate, a wiring substrate-side wiring formed on the wiring substrate, a chip substrate opposed to the wiring substrate, a chip substrate-side wiring formed on the chip substrate, a plurality of resonators formed on the chip substrate and electrically connected to the chip substrate-side wiring, a plurality of bumps electrically connected to the wiring substrate-side wiring and the chip substrate-side wiring, and a heat dissipation bump bonded to the region of the chip substrate-side wiring electrically connected to a plurality resonators and insulated from the wiring substrate-side wiring.

DETAILED DESCRIPTION

Figure 1:
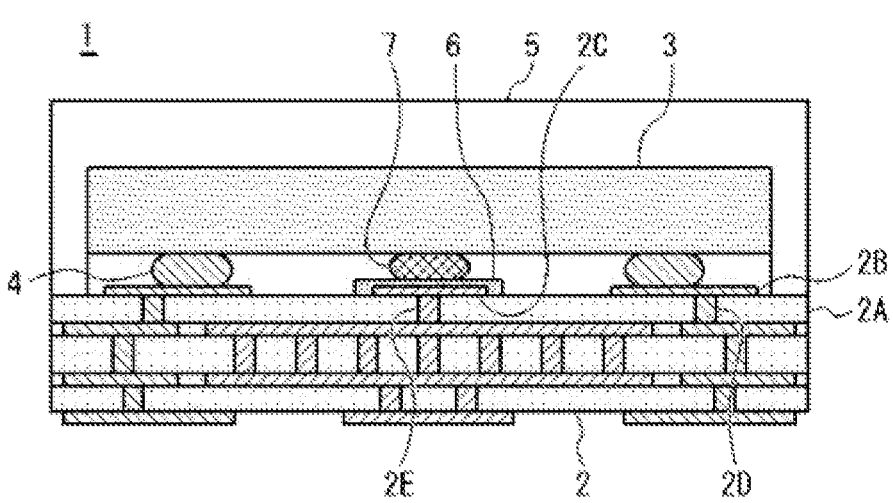
FIG. 1 is a longitudinal cross-sectional view of an acoustic wave device according to Embodiment 1 of the present invention.

Embodiments will be described with reference to the accompanying drawings. In the drawings, the same or corresponding parts are denoted by the same reference numerals. Duplicate descriptions of such portions may be simplified or omitted.

Embodiment 1

FIG. 1 is a longitudinal cross-sectional view of an acoustic wave device according to Embodiment 1 of the present invention.

FIG. 1 shows an example of an acoustic wave device that is a duplexer as the acoustic wave device 1.

As shown in FIG. 1, the acoustic wave device 1 includes a wiring substrate 2, a chip substrate 3, a plurality of bumps 4, and a sealing portion 5.

For example, the wiring substrate 2 includes a plurality of insulating layers 2A, a plurality of signal metallic layers 2B, a plurality of ground metallic layers 2C, a plurality of signal vias 2D and a plurality of ground vias 2E.

For example, the plurality of insulating layers 2A are low-temperature co-fired ceramics (Low Temperature Co-Fired Ceramics: LTCC) configured with a plurality of dielectric layers. The plurality of signal metallic layers 2B are alternately stacked with the plurality of insulating layers 2A as a portion of a wiring substrate-side wiring. The plurality of ground metallic layers 2C are alternately stacked with the plurality of insulating layers 2A as a portion of the wiring substrate-side wiring. Each of the plurality of signal vias 2D penetrates the insulating layers 2A as a portion of the wiring substrate-side wiring. One side of the signal vias 2D are electrically connected to the signal metallic layer 2B in contact with one surface of the insulating layer 2A. The other side of the signal vias 2D are electrically connected to the signal metallic layer 2B in contact with the other surface of the insulating layer 2A. Each of the plurality of ground vias 2E penetrates the insulating layers 2A as a portion of the wiring substrate-side wiring. One side of the ground vias 2E are electrically connected to the ground metallic layer 2C in contact with one surface of the insulating layer 2A. The other side of the ground vias 2E are electrically connected to the ground metallic layer 2C in contact with the other surface of the insulating layer 2A.

The chip substrate 3 faces the wiring substrate 2. For example, the chip substrate 3 is a substrate formed of a piezoelectric single crystal such as lithium tantalate, lithium niobate, or quartz crystal. For example, the chip substrate 3 is a substrate formed of piezoelectric ceramics. For example, the chip substrate 3 is a substrate in which a piezoelectric substrate and a support substrate are bonded by van der Waals force. For example, the support substrate is a substrate formed of sapphire, silicon, alumina, spinel, quartz, or glass.

The chip substrate 3 is a substrate on which an acoustic wave element (not shown in FIG. 1) is formed. For example, a receiving filter and a transmitting filter are formed on a main surface (a lower surface in FIG. 1) of the chip substrate 3.

The receiving filter is formed so that an electrical signal of a desired frequency band can pass through. For example, the receiving filter is a ladder-type filter including a plurality of series resonators and a plurality of parallel resonators.

The transmitting filter is formed so that an electrical signal of a desired frequency band can pass through. For example, the transmitting filter is a ladder-type filter including a plurality of series resonators and a plurality of parallel resonators.

The plurality of bumps 4 are electrically connected to the signal metallic layer 2B or the ground metallic layer 2C formed on the main surface (the upper surface in FIG. 1) of the wiring substrate 2. For example, the bump 4 is a gold bump. For example, the height of the bump 4 is 20 μm to 50 μm. The plurality of bumps 4 are electrically connected to the chip substrate-side wirings (not shown in FIG. 1) formed on the main surface (lower surface in FIG. 1) of the chip substrate 3.

The sealing portion 5 is formed to cover the chip substrate 3. The sealing portion 5 seals the chip substrate 3 together with the wiring substrate 2. For example, the sealing portion 5 is formed of an insulator such as a synthetic resin. For example, the sealing portion 5 is formed of metal. For example, the sealing portion 5 is formed of an insulating layer and a metal layer.

When the sealing portion 5 is formed of a synthetic resin, the synthetic resin is an epoxy resin, polyimide, or the like. Preferably, the sealing portion 5 is formed of an epoxy resin by a low-temperature curing process.

In the present Embodiment, a highly heat conductive insulating layer 6 and a heat dissipation bump 7 are included.

The highly heat conductive insulating layer 6 is formed on a part of the upper surface of the ground metallic layer 2C in the central portion of the wiring substrate 2. For example, the highly heat conductive insulating layer 6 is formed of epoxy resin, polyimide resin, silicon, solder resist, boron nitride, aluminum nitride, aluminum oxide, zinc oxide, or silicon oxide.

The heat dissipation bump 7 is electrically connected to a central portion of the chip substrate-side wiring. The heat dissipation bump 7 is in contact with the highly heat conductive insulating layer 6. The heat dissipation bump 7 is insulated from the wiring substrate-side wiring. Specifically, the heat dissipation bump 7 is insulated from the plurality of signal metallic layers 2B, the plurality of ground metallic layers 2C, the plurality of signal vias 2D, and the plurality of ground vias 2E.

Figure 2:
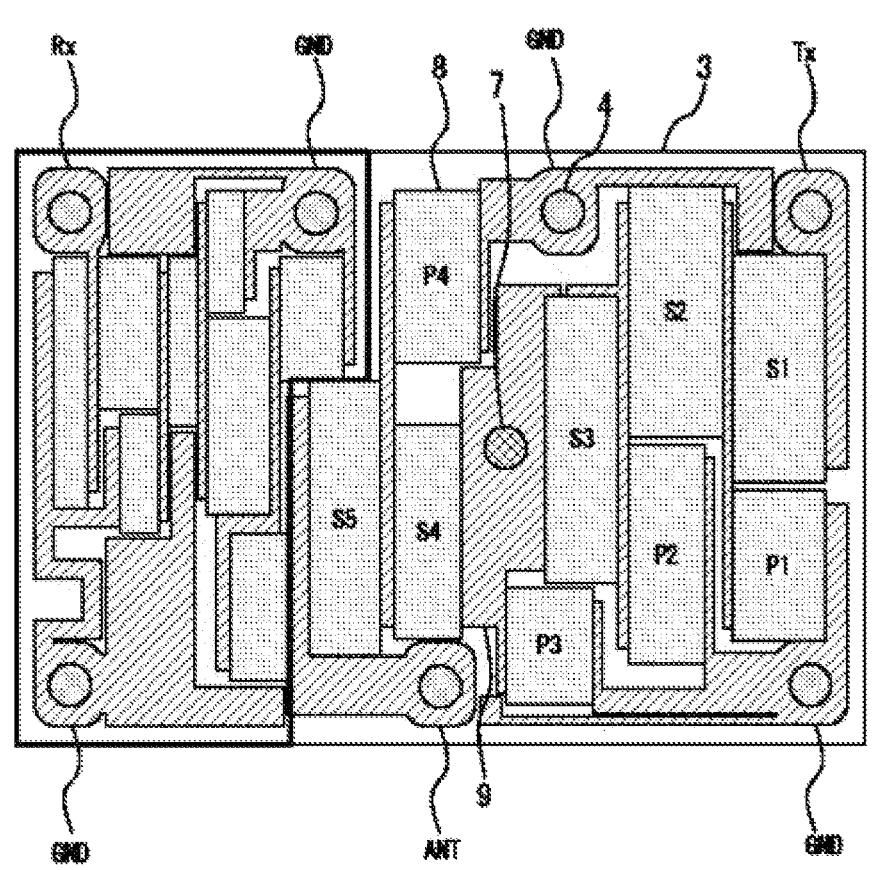
FIG. 2 is a plan view of a chip substrate of the acoustic wave device according to Embodiment 1 of the present invention.

Next, the configuration of the chip substrate 3 will be described with reference to FIG. 2. FIG. 2 is a plan view of the chip substrate of the acoustic wave device according to Embodiment 1.

As shown in FIG. 2, a plurality of acoustic wave elements 8 and a wiring pattern 9 are formed on the main surface of the chip substrate 3.

The plurality of acoustic wave elements 8 include a plurality of series resonators S1, S2, S3, S4, S5 and a plurality of parallel resonators P1, P2, P3, P4.

The plurality of series resonators S1, S2, S3, S4, S5 and the plurality of parallel resonator P1, P2, P3, P4 are formed to have a function as the transmitting filter. The other series resonators and the other parallel resonators are formed to have a function as the receiving filter.

For example, the wiring pattern 9 is formed of a metal or an alloy such as silver, aluminum, copper, titanium, or palladium as the chip substrate-side wiring. For example, the wiring pattern 9 is formed by stacking a plurality of metal layers. For example, the thickness of the wiring pattern 9 is 150 nm to 400 nm.

The wiring pattern 9 is electrically connected to the acoustic wave element 8. The wiring pattern 9 includes an antenna bump pad ANT, a transmitting bump pad Tx, a receiving bump pad Rx, and four ground bump pads GND. These bump pads are electrically connected to the bump 4.

In FIG. 2, the heat dissipation bump 7 is directly bonded to a region electrically connected to adjacent resonators in the wiring pattern 9. Specifically, the heat dissipation bump 7 is directly bonded to regions electrically connected to the adjacent series resonator S3, S4 in the wiring pattern 9.

Figure 3:
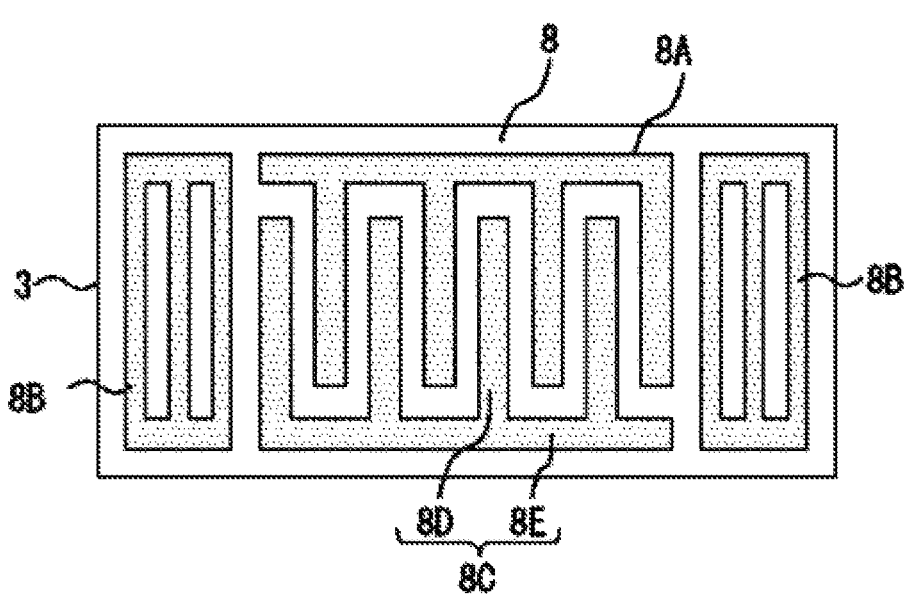
FIG. 3 is a diagram illustrating a first example of an acoustic wave element of the acoustic wave device according to Embodiment 1 of the present invention.

Next, a first example of the acoustic wave element 8 will be described with reference to FIG. 3. FIG. 3 is a diagram illustrating a first example of an acoustic wave element of the acoustic wave device according to Embodiment 1 of the present invention.

In FIG. 3, the acoustic wave element 8 is a surface wave resonator. As shown in FIG. 3, an IDT (Interdigital Transducer) 8A and a pair of reflectors 8B are formed on the first main surface of the chip substrate 3. The IDT 8A and the pair of reflectors 8B are provided so as to excite the surface acoustic wave.

For example, the IDT 8A and the pair of reflectors 8B are made of aluminum-copper alloys. For example, the IDT 8A and the pair of reflectors 8B may be formed of any suitable metallic material, such as titanium, palladium, silver, or alloys thereof. For example, the IDT 8A and the pair of reflectors 8B are formed of a stacked metal films in which a plurality of metal layers is stacked. For example, the thickness of the IDT 8A and the pair of reflectors 8B is 150 nm to 400 nm.

The IDT 8A comprises a pair of comb-shaped electrodes 8C. The pair of comb-shaped electrodes 8C are opposed to each other. The comb-shaped electrode 8C includes a plurality of electrode fingers 8D and a busbar 8E. The plurality of electrode fingers 8D are longitudinally aligned. The busbar 8E connects the plurality of electrode fingers 8D.

One of the pair of reflectors 8B adjoins one side of the IDT 8A. The other of the pair of reflectors 8B adjoins the other side of the IDT 8A.

Figure 4:
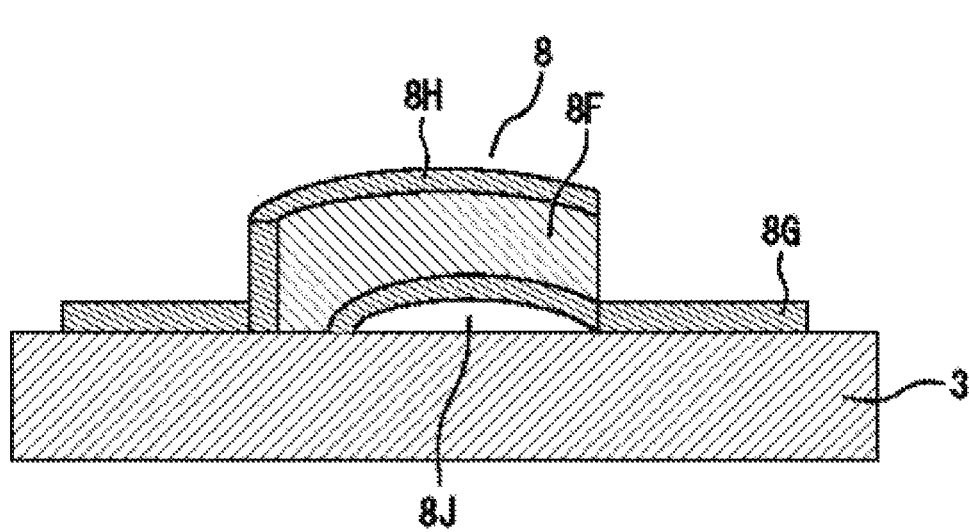
FIG. 4 is a diagram illustrating a second example of the acoustic wave element of the acoustic wave device according to Embodiment 1 of the present invention.

Next, a second example of the acoustic wave element 8 will be described with reference to FIG. 4. FIG. 4 is a diagram illustrating the second example of an acoustic wave element of the acoustic wave device according to Embodiment 1 of the present invention.

In FIG. 4, the acoustic wave element 8 is an acoustic thin film resonator. For example, the chip substrate 3 is a semiconductor substrate such as silicon, or an insulating substrate such as sapphire, alumina, spinel, or glass.

A piezoelectric film 8F is provided on the main surface of the chip substrate 3. For example, the piezoelectric film 8F is formed of aluminum nitride.

A lower electrode 8G and an upper electrode 8H are provided to interpose the piezoelectric film 8F. For example, the lower electrode 8G and the upper electrode 8H are formed of a metal such as ruthenium.

The gap 8J is formed between the lower electrode 8G and the chip substrate 3.

In the acoustic thin film resonator, the lower electrode 8G and the upper electrode 8H excite an acoustic wave in a thickness longitudinal vibration-mode inside the piezoelectric film 8F.

According to Embodiment 1 described above, the heat dissipation bump 7 is bonded to a region of the wiring pattern 9 in which a plurality of resonators is electrically connected. The heat dissipation bump 7 is insulated from the wiring substrate side wiring. This can enhance the heat dissipation property of the chip substrate 3 while maintaining the function as the acoustic wave device 1. As a result, the power resistance of the chip substrate 3 can be improved by suppressing the migration of the resonator formed on the chip substrate 3.

In addition, the heat dissipation bump 7 is directly connected to regions electrically connected to the adjacent series resonators S3, S4 in the wiring pattern 9. This can enhance the heat dissipation property in a region where heat hardly escapes in the chip substrate 3. In particular, a temperature becomes high in the region electrically connected to the only adjacent series resonators. This can enhance the heat dissipation property of the chip substrate 3 when the heat dissipation bump 7 is directly connected to the region.

The heat dissipation bump 7 is connected to the wiring pattern 9 in the central portion of the chip substrate 3. This can enhance the heat dissipation property in a region where heat hardly escapes in the chip substrate 3.

The highly heat conductive insulating layer 6 is formed on a portion of an upper surface of the ground metallic layer 2C. The heat dissipation bump 7 is in contact with the highly heat conductive insulating layer 6. This can more surely enhance the heat dissipation property of the chip substrate 3 while ensuring the insulating property between the regions electrically connected to the adjacent series resonators S3, S4 and the ground metallic layer 2C in the wiring pattern 9.

The highly heat conductive insulating layer 6 is formed of epoxy resin, polyimide resin, silicon, solder resist, boron nitride, aluminum nitride, aluminum oxide, zinc oxide, or silicon oxide. This can more surely enhance the heat dissipation property of the chip substrate 3. In particular, boron nitride, aluminum nitride, and aluminum oxide have high heat conductivity. Specifically, the heat conductivity of the boron nitride is about 60 W/m K. The heat conductivity of the aluminum nitride is about 150 W/m K. The heat conductivity of aluminum oxide is about 29 W/m K. This can more surely enhance the heat dissipation property of the chip substrate 3 when any one of boron nitride, aluminum nitride, and aluminum oxide is used as the highly heat conductive insulating layer 6.

In the first example of the acoustic wave element 8, the resonator is a surface acoustic wave resonator. This can enhance the heat dissipation property of the chip substrate 3 on which the surface acoustic wave resonator is mounted.

In the second example of the acoustic wave element 8, the resonator is an acoustic thin film resonator. This can enhance the heat dissipation property of the chip substrate 3 on which the acoustic thin film resonator is mounted.

A parasitic capacitance is generated between the ground metallic layer 2C, the highly heat conductive insulating layer 6, and the heat dissipation bumps 7. For example, the parasitic capacitance is about 0.09 pF when the dielectric constant of the highly heat conductive insulating layer 6 formed of aluminum nitride or aluminum oxide is 9, the thickness of the highly heat conductive insulating layer 6 is 10 μm, and the collapse diameter of the heat dissipation bump 7 is 120 μm. Thus, the parasitic capacitance has a small value. Therefore, the parasitic capacitance hardly affects the circuit characteristics of the acoustic wave device 1.

Embodiment 2

Figures 5, 6:
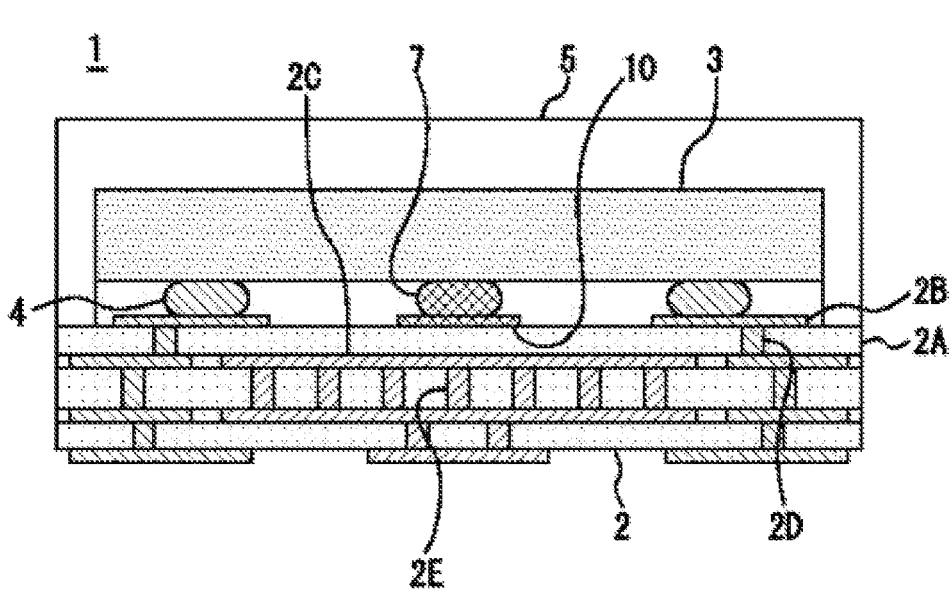
FIG. 5 is a longitudinal sectional view of an acoustic wave device according to Embodiment 2 of the present invention.
FIG. 6 is a longitudinal sectional view of an acoustic wave device according to Embodiment 3 of the present invention.

FIG. 5 is a longitudinal sectional view of an acoustic wave device according to Embodiment 2. The same reference numerals denote the same or corresponding elements in Embodiment 1, details of which are not explained herein.

As shown in FIG. 5, a heat dissipation metallic layer 10 is formed on the main surface of the wiring substrate 2. The heat dissipation metallic layer 10 is not electrically connected to the wiring substrate-side wiring. Specifically, the heat dissipation metallic layer 10 is insulated from the plurality of signal metallic layers 2B, the plurality of ground metallic layers 2C, the plurality of signal vias 2D, and the plurality of ground vias 2E.

The heat dissipation bump 7 is directly bonded to the heat dissipation metallic layer 10.

The heat dissipation bump 7 is directly bonded to the heat dissipation metal layer 10 according to Embodiment 2 described above. This can enhance the heat dissipation property of the chip substrate 3.

Embodiment 3

FIG. 6 is a longitudinal sectional view of an acoustic wave device according to Embodiment 3. The same reference numerals denote the same or corresponding elements in Embodiment 1, details of which are not explained herein.

As shown in FIG. 6, the plurality of heat dissipation metallic layers 10 are stacked through the insulating layer 2A. A heat dissipation via 11 penetrates the insulating layers 2A. One side of the heat dissipation via 11 is electrically connected to the heat dissipation metallic layer 10 in contact with one surface of the insulating layer 2A. The other side of the heat dissipation via 11 is electrically connected to the heat dissipation metallic layer 10 in contact with the other surface of the insulating layer 2A.

The heat dissipation bump 7 is bonded to the heat dissipation metallic layer 10 exposed on the wiring substrate 2. Specifically, the heat dissipation bump 7 is bonded to the upper heat dissipation metallic layer 10 in FIG. 6.

The plurality of heat dissipation metallic layers 10 are stacked through the insulating layer 2A according to Embodiment 3 described above. The heat dissipation via 11 is electrically connected to the plurality of heat dissipation metallic layers 10. Therefore, the heat from the heat dissipation bump 7 passes through the upper heat dissipation metallic layer 10, the heat dissipation via 11, and the lower heat dissipation metallic layer 10. This can enhance the heat dissipation property of the chip substrate 3 more than Embodiment 2.

Embodiment 4

Figure 7:
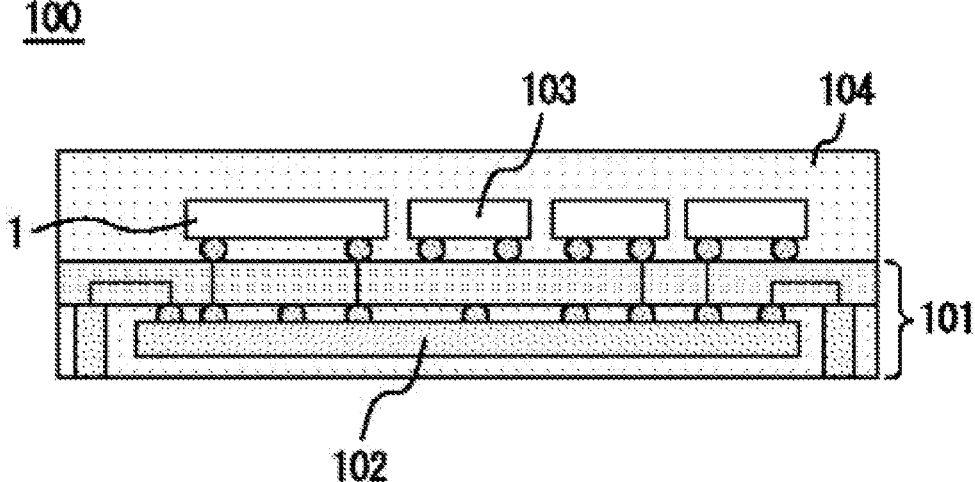
FIG. 7 is a longitudinal sectional view of a module to which an acoustic wave device is applied according to Embodiment 4.

FIG. 7 is a longitudinal sectional view of a module to which an acoustic wave device is applied according to Embodiment 4. The same reference numerals denote the same or corresponding elements in Embodiment 1, details of which are not explained herein.

In FIG. 7, a module 100 includes a wiring substrate 101, an integrated circuit component 102, the acoustic wave device 1, an inductor 103, and a sealing portion 104.

The wiring substrate 101 is equivalent to the wiring substrate 2 of Embodiment 1.

Although not shown, the integrated circuit component 102 is mounted inside the wiring substrate 101. The integrated circuit component 102 includes a switching circuit and a low noise amplifier.

The acoustic wave device 1 is mounted on the main surface of the wiring substrate 101.

The inductor 103 is mounted on the main surface of the wiring substrate 101. The inductor 103 is mounted for impedance matching. For example, the inductor 103 is Integrated Passive Device (IPD).

The sealing portion 104 seals a plurality of electronic components including the acoustic wave device 1.

The module 100 includes the acoustic wave device 1 according to Embodiment 4. described above. This realize the module 100 including the acoustic wave device 1 with high heat dissipation.

While several aspects of at least one embodiment have been described, it is to be understood that various modifications and improvements will readily occur to those skilled in the art. Such modifications and improvements are intended to be part of the present disclosure and are intended to be within the scope of the present disclosure.

It is to be understood that the embodiments of the methods and apparatus described herein are not limited in application to the structural and ordering details of the components set forth in the foregoing description or illustrated in the accompanying drawings. Methods and apparatus may be implemented in other embodiments or implemented in various manners. Specific implementations are given here for illustrative purposes only and are not intended to be limiting.

The phraseology and terminology used in the present disclosure are for the purpose of description and should not be regarded as limiting. The use of "including," "comprising," "having," and variations thereof herein means the inclusion of the items listed hereinafter and equivalents thereof, as well as additional items.

The reference to "or" may be construed so that any term described using "or" may be indicative of one, more than one, and all of the terms of that description.

References to front, back, left, right, top, bottom, and side are intended for convenience of description. Such references are not intended to limit the components of the present disclosure to any one positional or spatial orientation. Accordingly, the foregoing description and drawings are by way of example only.

What is claimed is:

1. An acoustic wave device comprising:
a wiring substrate;
a wiring substrate-side wiring formed on the wiring substrate;
a chip substrate opposed to the wiring substrate;
a chip substrate-side wiring formed on the chip substrate;
a plurality of resonators formed on the chip substrate and electrically connected to the chip substrate-side wiring;

a plurality of bumps electrically connected to the wiring substrate-side wiring and the chip substrate-side wiring;
a heat dissipation bump bonded to a region of the chip substrate-side wiring electrically connected to a plurality of resonators and insulated from the wiring substrate-side wiring; and
a highly heat conductive insulating layer formed on the wiring substrate-side wiring, wherein the heat dissipation bump is in contact with the highly heat conductive insulating layer.

2. The acoustic wave device according to claim 1, wherein the highly heat conductive insulating layer is provided on a ground metallic layer as the wiring substrate-side wiring.

3. The acoustic wave device according to claim 1, wherein the highly heat conductive insulating layer is formed of epoxy resin, polyimide resin, silicon, solder resist, boron nitride, aluminum nitride, aluminum oxide, zinc oxide, or silicon oxide.

4. An acoustic wave device comprising:
a wiring substrate;
a wiring substrate-side wiring formed on the wiring substrate;
a chip substrate opposed to the wiring substrate;
a chip substrate-side wiring formed on the chip substrate;
a plurality of resonators formed on the chip substrate and electrically connected to the chip substrate-side wiring;
a plurality of bumps electrically connected to the wiring substrate-side wiring and the chip substrate-side wiring;
a heat dissipation bump bonded to a region of the chip substrate-side wiring electrically connected to a plurality of resonators and insulated from the wiring substrate-side wiring,
wherein the wiring substrate further comprising
an insulating layer,
a plurality of heat dissipation metallic layers stacked through the insulating layer and not electrically connected to the wiring substrate-side wiring,
a heat dissipation via penetrating the insulating layer and electrically connected to the plurality of heat dissipation metallic layers,
wherein the heat dissipation bump is bonded to one of the heat dissipation metallic layers formed on an exposed surface of the wiring substrate.

* * * * *